United States Patent
Campos Canton et al.

(10) Patent No.: US 8,823,464 B2
(45) Date of Patent: Sep. 2, 2014

(54) RECONFIGURABLE MULTIVIBRATOR ELEMENT BASED ON CHAOS CONTROL

(71) Applicant: Instituto Potosino de Investigación Científica y Tecnológica A.C., San Luis Potosi (MX)

(72) Inventors: Eric Campos Canton, San Luis de Potosi (MX); Isaac Campos Canton, San Luis de la Paz (MX); Juan Gonzalo Barajas Ramirez, San Luis Potosi (MX); Alejando Ricardo Femat Flores, San Luis Potosi (MX)

(73) Assignee: Instituto Potosino de Investigacion Cientifica y Tecnológica A.C., San Luis Potosi (MX)

( * ) Notice: Subject to any disclaimer, the term of this patent is extended or adjusted under 35 U.S.C. 154(b) by 0 days.

(21) Appl. No.: 13/662,927

(22) Filed: Oct. 29, 2012

(65) Prior Publication Data
US 2013/0106481 A1  May 2, 2013

Related U.S. Application Data

(60) Provisional application No. 61/554,187, filed on Nov. 1, 2011.

(51) Int. Cl.
*H03K 3/02* (2006.01)
(52) U.S. Cl.
USPC .......................................... 331/144; 327/197
(58) Field of Classification Search
USPC .......................................... 331/144; 327/197
See application file for complete search history.

(56) References Cited

U.S. PATENT DOCUMENTS

| 731,082 A | 6/1903 | Strecker |
| 4,081,840 A | 3/1978 | Kolm |
| 4,191,927 A | 3/1980 | Minakuchi |
| 4,301,427 A | 11/1981 | Suzuki et al. |
| 4,430,682 A | 2/1984 | Babsch |
| 6,281,732 B1 | 8/2001 | Mirow |

(Continued)

FOREIGN PATENT DOCUMENTS

GB  1416931  12/1975

OTHER PUBLICATIONS

Sinha, S. & Ditto, W. 1998 "Dynamics based computations," Phys. Rev. Lett. 81, 2156-2159.

(Continued)

*Primary Examiner* — Joseph Chang
(74) *Attorney, Agent, or Firm* — Defillo & Associates, Inc.; Evelyn A. Defilló

(57) ABSTRACT

A reconfigurable element based on nonlinear (chaotic) dynamics is adapted to implement the three different multivibrator configurations. A nonlinear dynamical system, under parameter modulating control, operates as a tunable oscillator with different dynamical regimes which in turn provide the different multivibrator configurations (monostable, astable, and bistable). The reconfigurable multivibrator is realized as a tunable circuit which includes an input stage for receiving at least one input voltage signal and an output stage that produces a digital two-level electric output signal. The all-in-one reconfigurable multivibrator device consisting of a nonlinear oscillator circuit electrically coupled to the input/output circuitry is used in at least, but not limited to three basic applications, namely, an irregular width pulse generator, a rising flank trigger and a full RS flip-flop device.

11 Claims, 2 Drawing Sheets

(56) References Cited

U.S. PATENT DOCUMENTS

| | | | |
|---|---|---|---|
| 6,600,379 B2 * | 7/2003 | Anderson | 331/113 R |
| 7,096,437 B2 | 8/2006 | Ditto et al. | |
| 7,415,683 B2 | 8/2008 | Ditto et al. | |
| 7,453,285 B2 | 11/2008 | Kiel et al. | |
| 7,863,937 B2 | 1/2011 | Ditto et al. | |
| 7,924,059 B2 | 4/2011 | Ditto et al. | |
| 7,925,131 B2 | 4/2011 | Bogoni et al. | |
| 7,925,814 B2 | 4/2011 | Schneiderwind | |
| 7,973,566 B2 | 7/2011 | Ditto et al. | |
| 8,091,062 B2 | 1/2012 | Ditto | |

OTHER PUBLICATIONS

Murali K., Sudeshna S. 2003 "Experimental realization of chaos control by thresholding", Physical Review E., vol. 68, Jul. 14, 2003.

Cafagna, D. & Grassi, G. 2005. "Chaos-based computation via Chua's circuit: Parallel computing with application to the SR flip-flop," Int. Symp. Sign. Circuits Syst. 2, 749-752.

Campos-Cantón E., J. G. Barajas-Ramírez, G. Solís-Perales, R. Femat, 2010, "Multiscroll attractors by switching systems". CHAOS, 20: 013116.

\* cited by examiner

RECONFIGURABLE MULTIVIBRATOR ELEMENT BASED ON CHAOS CONTROL

CROSS-REFERENCE TO RELATED APPLICATIONS

This application claims the benefit of priority to U.S. Provisional Application No. 61/554,187 filed Nov. 1, 2011, the contents of which are incorporated herein by reference.

FIELD OF THE INVENTION

The present invention relates to the field of reconfigurable structures and, more particularly, reconfigurable multivibrator electronic devices. As an underling principle, this invention uses the dynamical richness of nonlinear (chaotic) systems to provide different alternatives or embodiments of multivibrators. Where a nonlinear oscillator circuit, a simple input circuit, and a comparator function (output circuit) are made to operate in astable, monostable or bistable mode.

BACKGROUND OF INVENTION

Chaos in known to be useful. In fact, under certain conditions, it is a desirable feature of systems and circuits. The dynamical richness of chaotic behavior has significant potential applications to real-world problems, including secure communications, persistent excitation, information processing and incryption, to mention but a few (Ott, 2002 "Chaos in Dynamical Systems (Cambridge University Press, UK); Strogatz, S. H. 2001 "Nonlinear Dynamics, and Chaos: with applications to physics, biology, chemistry, and engineering (Westview Press, USA)); Tam et al., 2007 "Communications with Chaos: Multiple access techniques and performance (Elsevier Science Press, Great Britain)). In particular, the present invention uses chaos theory to design a reconfigurable multivibrator element in order to have different configurations in an all-in-one circuit.

A multivibrator circuit is a simple two-state system that has only one of three possible configurations, these are:

(i) Astable multivibrator, in this configuration, both states of the system are unstable. As a consequence, the output of the circuit spends a given amount of time in one state, and then in the other, moving back and forth from one to the other in a continuously repeated cycle. Usually, this configuration is used to generate sequences and pulses with a given frequency and width, see for example patents JP53085479, U.S. Pat. No. 4,191,927.

(ii) Monostable multivibrator, in this configuration, one state of the circuit is stable while the other is unstable. As such, the system may spend some time in the unstable state, but eventually will move into the stable state and remain there afterwards. This configuration can be used, for instance, to define a time-period of activity measured from an event, for example in JP57044768, U.S. Pat. No. 4,430,682 monostable multivibrators are used in motor timing.

(iii) Bistable multivibrator, in this configuration both states are stable. This implies that the circuit remains in its current state, until being forced to change to the other by an external event or input. A multivibrator system in bistable configuration can be used as a fundamental building block of a register or memory device, for example in U.S. Pat. Nos. 4,081,840 and 4,191,927, a bistable multivibrator in used as part of a switching device.

There is great interest in developing new working paradigms to complement and even replace current statically configurable architectures. One of the newest ideas is chaos computing which focuses on the development of devices with dynamic logic architecture and employs nonlinear or chaotic elements in logic operations. Application of chaos computing requires the development of dynamic logic gates (also called logic cells) that are able to change their response according to threshold reference signals and offset signals in order to produce different logic gates. These dynamic logic gates would support development of logic chips for next generation computers. Current inventions related to logic gates that exploit features of nonlinear dynamic systems through their electronic implementations are, for example, U.S. Pat. Nos. 8,091,062, 7,973,566, 7,924,059, 7,863,937, 7,415,683, 7,096,437, 7,453,285, 7,925,814, 7,925,131 and US patent application 2010/0219858. These inventions make use of chaotic computing architectures based on nonlinear elements, while the present invention discloses reconfigurable multivibrator using a nonlinear oscillator.

Reconfigurable structures based on chaos have been investigated for a long time, with significant results, such as: [Cafagna, D. & Grassi, G. 2005. "Chaos-based computation via Chua's circuit: Parallel computing with application to the SR flip-flop," Int. Symp. Sign. Circuits Syst. 2, 749-752.] where the chaotic Chua's circuit use it to obtain two logic gates from two state variables, from those chaos-based logic they implemented two NOR gates and build a standard flip-flop device. Alternative realizations of chaos-based logic gate have been reported [Sinha, S. & Ditto, W. 1998 "Dynamics based computations," Phys. Rev. Lett. 81, 2156-2159; Murali K., Sudeshna S. 2003 "Experimental realization of chaos control by thresholding", Physical Review E., vol. 68, Jul. 14, 2003; Campos-Cantón E., J. G. Barajas-Ramírez, G. Solís-Perales, R. Femat, 2010, "Multiscroll attractors by switching systems". CHAOS, 20: 013116]. With these logic gates is possible to build just a static bistable multivibrator.

Different methods for the construction of multivibrators have been disclosed, for example U.S. Pat. Nos. 6,281,732, 4,301,427, and GB1416931 describe constructions of astable, monostable and bistable multivibrators based on stabilized amplifiers, mosfets and inverters. However, unlike the present invention these multivibrators have fixed configurations, without the possibility of reconfiguration. In many applications of multivibrators more than one configuration is required, for example in devices for measurement and control of temperature, acoustic, and motor timing (see patents U.S. Pat. No. 4,081,840, U.S. Pat. No. 731,082, JP53085479). In these inventions it is compulsory to combine more than one multivibrator configuration. The reconfigurable multivibrator provided in the present invention discloses a single device to obtain an all-in-one multivibrator configuration (monostable, astable, and bistable).

SUMMARY OF THE INVENTION

The instant application discloses and claims a dynamically reconfigurable multivibrator element, comprising: an input block coupled to a nonlinear chaotic system with a control input that adjust the parameters in order to change a desirable multivibrator configuration and coupled to an output block; wherein the nonlinear chaotic system is a Piecewise-linear (PWL) chaotic system and wherein the output block comprises at least one comparator circuit.

In said dynamically reconfigurable multivibrator element the adjustment of the parameters allows to get the three different multivibrator configurations, astable, bistable and monostable. Furthermore, wherein the dynamically reconfigurable multivibrator element is set to bistable configuration becomes the embodiment of a full SR flip-flop. wherein the full SR flip-flop accepts all the logic inputs (S,R): (0,0), (0,1), (1,0) and (1,1) and responds as $(Q_{n+1})$: $Q_n$, 0, 1, and $Q_n$, respectively.

Also, said dynamically reconfigurable multivibrator element, when is set to astable configuration becomes the embodiment of a pulse generator with irregular period when the nonlinear element is oscillating chaotically or regular pulses when is oscillating into a limit cycle.

In a further embodiment, said dynamically reconfigurable multivibrator element, when is set to monostable configuration becomes unstable in the state logic zero and stable in the state logic one.

As a particular embodiment said dynamically reconfigurable multivibrator element, comprises an input block, a piecewise-linear (PWL) chaotic system with a control input that adjusts the parameters in order to change a desirable multivibrator configuration, and an output block with at least one comparator circuit.

Also, it is described an claimed a SR flip-flop device, comprising the above mentioned dynamically reconfigurable multivibrator elements.

Finally a pulse generator device is described, comprising the above disclosed dynamically reconfigurable multivibrator elements.

DETAILED DESCRIPTION OF THE INVENTION

Figure 1:
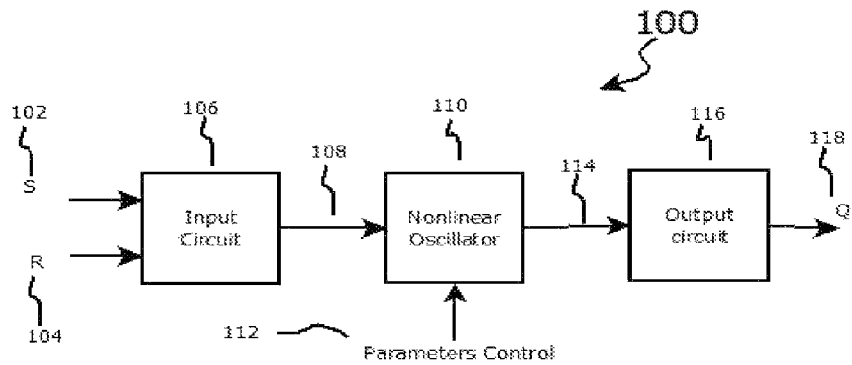
FIG. 1 is a block diagram of a reconfigurable dynamic multivibrator device using an input circuit, a nonlinear oscillator and comparator function in the output circuit.

The instant invention comprises a dynamically reconfigurable multivibrator element based on nonlinear (chaotic) dynamics which through a parameter modulating control specially designed to operate as one of the three multivibrator configurations, namely, astable, monostable or bistable multivibrator circuits. The advantage of the element is that a single device (all-in-one) is capable of carrying out the three configurations without additional multivibrator elements.

As for the scope of the invention, the term element should be understood as a circuit that can be incorporated to a larger system, device or circuit suitable for the purposes of the invention.

The invention comprises nonlinear dynamics of a Piecewise Linear (PWL) system used to provide the three different multivibrator configurations. Structurally PWL systems are very simple, consisting of linear descriptions for each partition of their phase space. This simplicity makes them particularly well-suited for electronic implementations, e.g. via operational amplifiers. On the other hand, they can produce dynamical behaviors that range from stable fixed points to multiscroll chaotic attractors. As described in [Campos-Cantón E., J. G. Barajas-Ramírez, G. Solís-Perales, R. Femat, 2010, "Multiscroll attractors by switching systems". CHAOS, 20: 013116], different dynamical regimes can be imposed on the solutions of a PWL system by properly tuning the system's parameters. In this way, an analogy between the three multivibrator configurations and the dynamical regimes of a PWL system can be obtained as follows:

(i) Astable Multivibrator. By applying parameter modulation control, a PWL system can be made to have a double-scroll chaotic attractor with a basin of attraction covering its entire domain. By associating to each scroll a different output state, as the trajectories of the system move along the chaotic attractor, the output state will continuously switch from one output state to the other, which corresponds to the behavior of an astable multivibrator. It is noteworthy that since the transitions between the output states occurs as the trajectory moves along the chaotic attractor, the transitions will occur at irregular times and not with a fixed period.

(ii) Monostable Multivibrator. A controlled PWL system can be made to have a single-scroll chaotic attractor for its entire domain. By dividing the domain along the center axis with the single-scroll attractor contained in one side, it is possible to associate an output state to the empty part of the domain and the other output state to the single-scroll attractor. Then, as the trajectories move from the empty half of the domain towards the single-scroll attractor, the output state will be at one value for a while, and when the trajectory reaches the attractor, the output will switch to the other state and remain at that value from that moment on. In this way, the monostable multivibrator behavior is obtained from a PWL system via chaos control.

(iii) Bistable Multivibrator. Under appropriate parameter modulating control a PWL system can be made to have two different stable single-scroll attractors located each side of the center axis of the domain. When there are two stable chaotic attractors and it is possible to generate only one of them by means of changing the initial conditions, it is said that the system exhibits bistable chaos. In this case the trajectories will follow only one of the attractors according to their initial conditions. That is, in bistable chaos, each attractor has its own distinct basin of attraction. Then, associating each output state to the basins of attraction of each single-scroll chaotic attractor, if an initial condition is set to one of the attractors the output state will remain at that value from that moment on. However, if the initial condition is set to the opposite side, the other output state will be shown from that moment onwards. As such, the behavior of the bistable multivibrator is obtained from the controlled PWL system.

Thus, the present invention provides a reconfigurable multivibrator that can be configured to function as any of a variety of different multivibrators such as a bistable multivibrator, a monostable multivibrator and an astable multivibrator. The functionality of the reconfigurable multivibrator can be altered by changing one or more parameters to the nonlinear oscillator. The reconfigurable multivibrator can function, for example, as one type of multivibrator, such as a bistable multivibrator, and during operation be instructed to begin operating or functioning as another type of multivibrator, such as an astable multivibrator or monostable multivibrator or combinations thereof. Applications are illustrated herein below by designing a circuit that functions as a pulse generator and a full S-R flip flop device based on the all-in-one reconfigurable multivibrator element.

Table I below illustrates a truth table of basic operations. For example, column 3 illustrates the function of a bistable multivibrator given inputs (S,R), column 4 shows the function of an astable multivibrator given inputs (S,R), and column 5 shows the function of a monostable multivibrator given inputs (S,R).

TABLE 1

| 1 S | 2 R | 3 Bistable $Q_n$ | 4 Astable $Q_n$ | 5 Monostable $Q_n$ |
|---|---|---|---|---|
| 0 | 0 | $Q_{n-1}$ | Free running | Free running |
| 0 | 1 | 0 | Not allowed | Not allowed |
| 1 | 0 | 1 | Not allowed | Not allowed |
| 1 | 1 | $Q_{n-1}$ | Free running | Free running |

FIG. 1 is a schematic diagram illustrating a high level circuit architecture 100 for a reconfigurable multivibrator in accordance with the present invention. Therefore, this FIG. 1 discloses the essential technical characteristic of the invention, and should be taken as the main principle of the same. As shown, the reconfigurable multivibrator can include a nonlinear oscillator 110, a parameters controller 112, an input circuit 106, and an output circuit 116. The parameters controller provides a tuning of parameters that change the stability of the nonlinear oscillator. The input block can receive the inputs signals S 102 and R 104, when S and R are equal the signal 108 is null but when they are different then signal 108 forced the nonlinear oscillator 110. The output block 116 receives the signal 114 which is compared with a reference signal in order to generate a logic zero or logic one that are given as the output Q 118.

The operation of the nonlinear oscillator 110 according to the present invention can be described by the mathematical model as follows:

$$\begin{pmatrix} \dot{x}_1 \\ \dot{x}_2 \\ \dot{x}_3 \end{pmatrix} = \begin{pmatrix} \alpha(x_2 - x_1 - f(x_1)) \\ x_1 - x_2 + x_3 \\ -\beta x_2 + \gamma x_3 \end{pmatrix}$$

where $f(x_1)$ is a nonlinear negative resistor which is described as $$f(x_1) = \begin{cases} b_1 x_1 - c_1, & \text{if } x_1 > 1; \\ a x_1, & \text{if } |x_1| \le 1; \\ b_2 x_1 + c_2, & \text{if } x_1 < -1; \end{cases}$$

with $c_i = b_i - a$, $i = 1, 2$. Thus, the nonlinear oscillator 110 can be implemented as a three dimensional Chua's system. Given a dynamics $(\dot{x}_1, \dot{x}_2, \dot{x}_3)^T$ corresponding to a physical device, the values of parameters and initial state satisfying the conditions derived from the truth table to be implemented must be determined. Still, those skilled in the art will recognize that other functions also can be used, including, but not limited to, discrete time chaotic functions.

EXAMPLES

Figure 2:
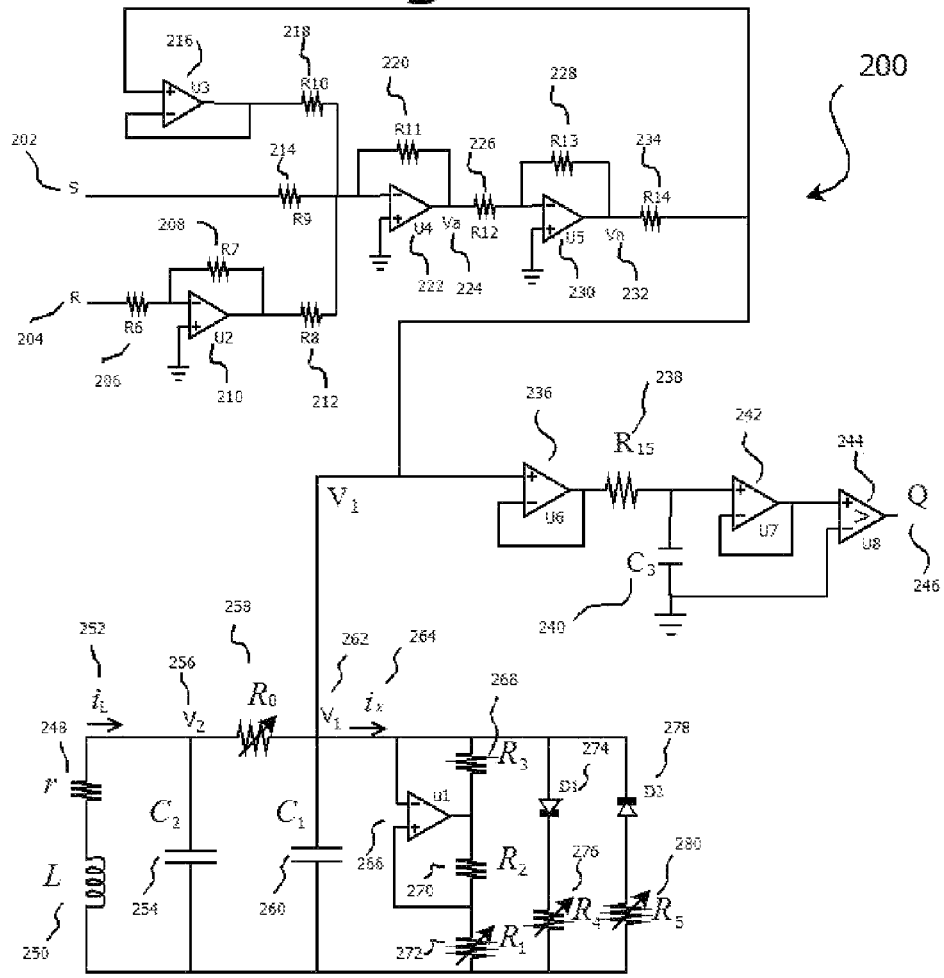
FIG. 2 is a circuit schematic of the reconfigurable multivibrator device of FIG. 1 according to one embodiment of the present invention; The elements 202, 204, 206, 208, 210, 212, 214, 216, 218, 220, 222, 224, 226, 228, 230, 232 and 234 constitute the input block, the output block is comprised by the elements 236, 238, 240, 242, 244 and 246, and the nonlinear oscillator is made up by the elements 248, 250, 252, 254, 256, 258, 260, 262, 264, 266, 268, 270, 272, 274, 276, 278 and 280.

As a preferred embodiment, that should be taken as a work example but not limiting the scope of the invention, FIG. 2 represents schematic diagram illustrating an exemplary circuit implementation of the dynamically reconfigurable multivibrator element 100 depicted in FIG. 1. The operation of the input block according to the present invention may be described as follows: there are two inputs 202 (S) and 204 (R) that are introduced to the system by the resistors 214 ($R_{209}$) and 206 ($R_{206}$). The input 204 (R) is passed through inverting amplifier given by the operational amplifier 210 ($U_2$) and the resistor 206 (R6) and 208 ($R_7$). The output of the operational amplifier 216 ($U_3$) is the voltage 262 ($V_1$) which is added with the input signal 202 (S) and the output of operational amplifier 210 (−R) through the resistors 212 ($R_8$), 214 ($R_9$), 218 ($R_{10}$) and 220 ($R_{11}$) and the operational amplifier 222 ($U_4$) by means of inverting adder. Thus the output of 222 ($V_a$) is R−S−$V_1$ (204-202-262) due to all the values of the resistor of the input block are equal to 1 k$\Omega$, except for the resistor 234 ($R_{14}$), which is set to 100 k$\Omega$. The voltage 224 ($V_a$) is passed through the inverting amplifier given by the resistors 226 ($R_{12}$) and 228 ($R_{13}$), and the operational amplifier 230 ($U_5$), generating the voltage 232 ($V_n$). The voltage 232 ($V_n$) is given by $V_1$+S−R, always that the inputs 202 and 204 are equal (S=R) the voltage 232 ($V_n$) is equal to the voltage 262 ($V_1$) and the current through the resistor 234 ($R_{14}$) is zero.

The operation of the output block according to the present invention may be described as follows: the input voltage for this block is 262 ($V_1$) that is passed through a buffer 236 ($U_6$) and after a low pass filter comprising resistor 238 ($R_{15}$) and the capacitor 240 ($C_3$), this signal is passed by a buffer 242 (U7) and a comparator 244 (U8), generating the output signal 246 (Q).

The nonlinear oscillator has the following relationship between the electronic components in FIG. 2 and the parameters of the mathematical model are:

$$\alpha = \frac{C_2}{C_1}, \beta = \frac{C_2 R_0^2}{L}, \gamma = \frac{C_2 R_0 r}{L}, a = -\frac{R_0 R_2}{R_1 R_3},$$

$$b_1 = -\frac{R_0 R_2}{R_1 R_3} + \frac{R_0}{R_4}, b_2 = -\frac{R_0 R_2}{R_1 R_3} + \frac{R_0}{R_5},$$

where the capacitor 260 $C_1$=100 nF, the capacitor 254 $C_2$=1 μF, the inductor 250 L=67.1 mH with internal resistance 248 r=2.57$\Omega$, the resistors 270 ($R_2$) and 268 ($R_3$) equal to 220$\Omega$. The resistors 258 ($R_0$), 272 ($R_1$), 276 ($R_4$) and 280 ($R_5$) are 5 k$\Omega$ potentiometers. The potentiometer 258 $R_0$ is tuned to 1003$\Omega$ the others according to the Table 2. The parameter $b_1$ is active when the diode 274 $D_1$ is forward bias voltage and the parameter $b_2$ is active when the diode 278 $D_2$ is forward bias voltage

TABLE 2

|  | Bistable | Astable | Monostable |
|---|---|---|---|
| $R_1$ tune to | 884 $\Omega$ | 825 $\Omega$ | 884 $\Omega$ |
| $R_4$ tune to | 4.062 k$\Omega$ | 3.058 k$\Omega$ | 4.062 k$\Omega$ |
| $R_5$ tune to | 4.062 k$\Omega$ | 3.058 k$\Omega$ | 3.515 k$\Omega$ |

The bistable form of multivibrator illustrated in FIG. 2 is controlled by the inputs according to the table 1 and the potentiometers 272 ($R_1$), 276 ($R_4$) and 280 ($R_5$) tune according to the table 2.

Figure 3:
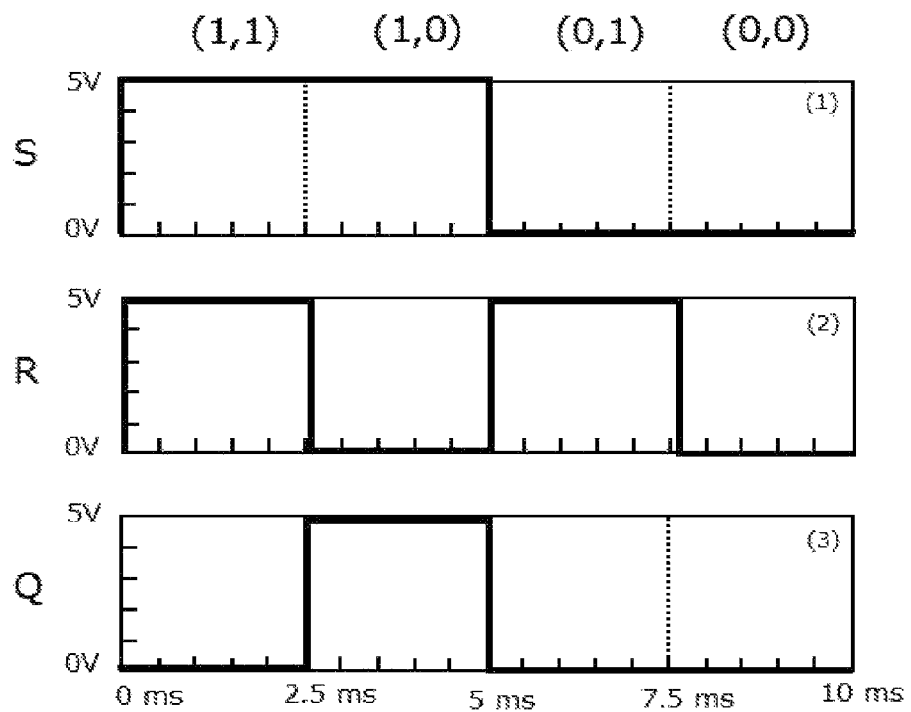
FIG. 3 is a series of timing graph illustrating timing sequences of implementations of a representative bistable multivibrator configuration formed in accordance with the inventive arrangements disclosed herein that generates a full RS flip-flop.

When the dynamically multivibrator element is configured as bistable, it becomes part, for example, of a full SR flip-flop device. Thus, FIG. 3 is a series of timing graph illustrating timing sequences of implementations of a representative bistable multivibrator configuration formed in accordance with the arrangements disclosed in an specific embodiment of the invention, which generates a full SR flip-flop. The timing sequences of the exemplary bistable multivibrator implementation, from top to bottom, represent: (1) first input S; (2) second input R; and (3) the output Q.

An advantage of the bistable form of the multivibrator according to the present invention is that all the entries are allowed, i.e., the system is determined for a particular entry (S, R)=(1,1); as is shown in the table 1.

The astable form of multivibrator illustrated in FIG. 2 is free-running when the potentiometers 272 ($R_1$), 276 ($R_4$) and 280 ($R_5$) are tuned according to the table 2, and the inputs are set at zero volts.

Figure 4:
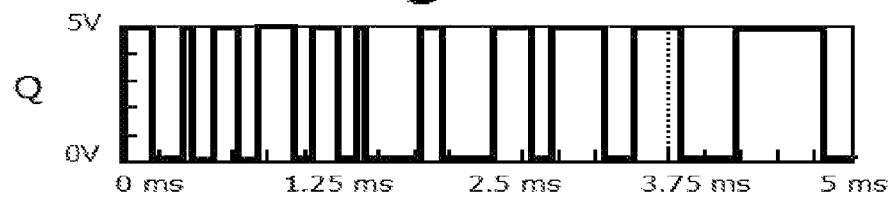
FIG. 4 is a series of timing graph illustrating timing sequences of implementations of an astable multivibrator configuration formed in accordance with the arrangements by using the dynamically reconfigurable multivibrator element disclosed in the instant invention.

When the dynamically multivibrator element is configured as astable, it becomes part of a, for example, a noise generator. Therefore, FIG. 4 is a series of timing graph illustrating timing sequences of implementations of a representative astable multivibrator configuration formed in accordance with a particular example of the dynamically reconfigurable multivibrator element of the instant invention. This multivibrator generates an aperiodic rectangular output wave and also can generate periodic rectangular output wave. The input circuitry can be omitted, since the astable multivibrator is shown in a free-running form, so the line form the resistor 234 to the node 262 ($V_1$) can be shut off.

An advantage of the astable form of the multivibrator according to the present invention provides for equal rise and fall times on the square wave, as well as symmetrical on and off periods. Furthermore, due to its nonlinear dynamics and the possibility to produce chaos is possible to generate irregular or chaotic square wave that can be used as a noise generator.

The monostable form of multivibrator illustrated in FIG. 2 is free-running when the potentiometers 272 ($R_1$), 276 ($R_4$) and 280 ($R_5$) are tuned according to Table 2, and the inputs are set at zero volts.

Figure 5:
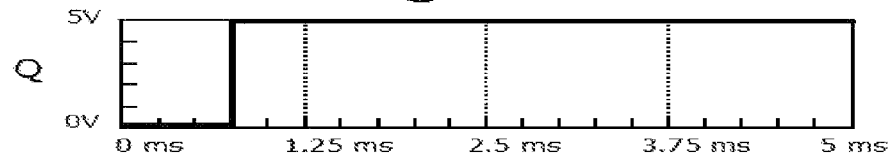
FIG. 5 is a series of timing graph illustrating timing sequences of implementations of a representative monostable multivibrator configuration formed in accordance with the inventive arrangements disclosed herein.

In such monostable configuration, FIG. 5 represents a series of timing graph illustrating timing sequences of implementations of a representative monostable multivibrator configuration formed according to the dynamically reconfigurable multivibrator element disclosed above.

As a consequence, one multivibrator, a set of multivibrators, or all of the multivibrators within the system can change functionality according to data provided as in Table 2, which parameters can change according to the application of the dynamically reconfigurable multivibrator element using an example that has incorporated specific analog components. Those skilled in the art will recognize that such components have been provided for purposes of illustration only. Therefore, any variety of different components, whether functional equivalents, variants, or alternatives of the analog components or of the higher level components (i.e. of FIG. 1) disclosed herein, can be used and are within the scope of the invention. As such, the invention is not limited to the use of a particular component or set of components.

In light of the above description, a dynamically reconfigurable multivibrator element is designed by adding modulation parameters which modify the stability properties of the linear subsystems. Because the chaos generation is exploited, the multivibrator element incorporates dynamical features onto the a logic-gate architecture.

Thus, the proposed dynamical logic structure is more adaptable than static logic-gates, as it is reconfigurable by parametric modulation. The reconfiguration allows us to achieve distinct tasks with the same circuit. that is, the proposed architecture might serve as a component of general purpose computing devices with a flexible structure. As a consequence of the parametric modulation, diverse scrolls are generated or inhibited around the equilibrium points of the continuously connected sections of the nonlinear (chaotic) system (such as the PWL system).

What is claimed is:

1. A dynamically reconfigurable multivibrator element comprising:
    an input block coupled to a nonlinear chaotic system with a control input that adjust parameters in order to change a desirable multivibrator configuration and coupled to an output block;
    wherein the adjustment of the parameters allows to get the three different multivibrator configurations, astable, bistable and monostable; and
    wherein the nonlinear chaotic system is a Piecewise-linear (PWL) chaotic system.

2. The dynamically reconfigurable multivibrator element according to claim 1, wherein the output block comprises at least one comparator circuit.

3. The dynamically reconfigurable multivibrator element according to claim 1, wherein is set to bistable configuration becomes the embodiment of a full SR flip-flop.

4. The dynamically reconfigurable multivibrator element according to claim 3, wherein the full RS flip-flop accept all the logic inputs (S,R): (0,0), (0,1), (1,0) and (1,1) and responds as ($Q_{n+1}$): $Q_n$, 0,1, and $Q_n$, respectively.

5. The dynamically reconfigurable multivibrator element according to claim 1, wherein when is set to astable configuration becomes the embodiment of a pulse generator with irregular period when the nonlinear element is oscillating chaotically or regular pulses when is oscillating into a limit cycle.

6. The dynamically reconfigurable multivibrator element according to claim 1, wherein when is set to monostable configuration becomes unstable in the state logic zero and stable in the state logic one.

7. A dynamically reconfigurable multivibrator element, comprising an input block, a piecewise-linear (PWL) chaotic system with a control input that adjusts the parameters in order to change a desirable multivibrator configuration, and an output block with at least one comparator circuit;
    wherein the adjustment of the parameters allows to get the three different multivibrator configurations, astable, bistable and monostable.

8. A SR flip-flop device, comprising the dynamically reconfigurable multivibrator element as claimed in claim 1.

9. A SR flip-flop device, comprising the dynamically reconfigurable multivibrator element as claimed in claim 7.

10. A pulse generator device, comprising the dynamically reconfigurable multivibrator element as claimed in claim 1.

11. A pulse generator device, comprising the dynamically reconfigurable multivibrator element as claimed in claim 7.

* * * * *